United States Patent
Kanamitsu et al.

(10) Patent No.: US 7,282,411 B2
(45) Date of Patent: Oct. 16, 2007

(54) METHOD OF MANUFACTURING A NONVOLATILE SEMICONDUCTOR MEMORY DEVICE

(75) Inventors: Kenji Kanamitsu, Hitachinaka (JP); Takashi Moriyama, Tsuchiura (JP); Naohiro Hosoda, Hitachinaka (JP); Keiichi Haraguchi, Hitachinaka (JP); Tetsuo Adachi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 362 days.

(21) Appl. No.: 11/036,023

(22) Filed: Jan. 18, 2005

(65) Prior Publication Data
US 2005/0164442 A1    Jul. 28, 2005

(30) Foreign Application Priority Data
Jan. 23, 2004  (JP) ............... 2004-015703

(51) Int. Cl.
    *H01L 21/336*  (2006.01)
(52) U.S. Cl. ............... 438/257; 438/259; 438/270
(58) Field of Classification Search ............... 438/257, 438/259, 270, 402, 201; 257/288, 296
    See application file for complete search history.

(56) References Cited

U.S. PATENT DOCUMENTS

2003/0181007 A1* 9/2003 Huang et al. ............... 438/257

FOREIGN PATENT DOCUMENTS

| JP | 2001-028428 | 1/2001 |
| JP | 2001-156275 | 6/2001 |

* cited by examiner

*Primary Examiner*—Hsien-Ming Lee
(74) *Attorney, Agent, or Firm*—Antonelli, Terry, Stout & Kraus, LLP.

(57) ABSTRACT

An AND flash memory of the type wherein a memory cell is constituted of n-type semiconductor regions (a source and a drain) formed in a p-type well of a semiconductor substrate and three gates (including a floating gate, a control gate and a selective gate) is manufactured. In the manufacture, arsenic (As) is introduced into a p-type well in the vicinity of one of side walls of the selective gate to form n-type semiconductor regions (a source and a drain). Thereafter, to cope with a drain disturb problem, the substrate is thermally treated by use of an ISSG (In-Situ Steam Generation) oxidation method so that a first gate, insulating film disposed in the vicinity of one of side walls, at which the n-type semiconductor regions have been formed, is formed thick.

17 Claims, 14 Drawing Sheets

METHOD OF MANUFACTURING A NONVOLATILE SEMICONDUCTOR MEMORY DEVICE

CROSS-REFERENCE TO RELATED APPLICATION

The present application claims priority from Japanese patent application No. 2004-015703, filed on Jan. 23, 2004, the content of which is hereby incorporated by reference into this application.

BACKGROUND OF THE INVENTION

This invention relates to a nonvolatile semiconductor memory device and a technique of manufacturing the same. More particularly, the invention relates to a technique effective for improving a manufacturing yield and reliability of a nonvolatile semiconductor memory device.

A flash memory, which is a semiconductor nonvolatile memory, has been widely used as a data storage memory of good portability.

The memory array systems of a flash memory typically include a NAND type wherein memory cells are connected in series and an AND type wherein memory cells are connected in parallel. Especially, the latter makes use of a hot electron writing method, thus ensuring high-speed writing. Additionally, the memory array arrangement is in parallel connection, not in series connection like the NAND type, and thus, has the feature that it is unlikely to suffer an influence of memory information of other cells.

The AND flash memory is disclosed, for example, in Japanese Unexamined Patent Publication No. 2001-156275. The memory cell set out in this publication has a selective transistor element provided with a switch gate electrode on a semiconductor substrate, a memory cell transistor element that includes a gate insulating film discretely having traps at opposite sides thereof and a memory gate electrode, and a diffusion layer formed at the outside thereof and connected to a source line/bit line.

Japanese Unexamined Patent Publication No. 2001-28428 discloses an AND flash memory of a virtual ground type wherein a memory cell is constituted of n-type semiconductor regions (source, drain) formed in a p-type well of a semiconductor substrate and three gates.

SUMMARY OF THE INVENTION

The AND flash memory which we are now under development is constituted of memory cells each of which includes n-type semiconductor regions (source, drain) formed in a p-type well of a semiconductor substrate and three gates. The three gates of the memory cell include a floating gate, a control gate and a selective gate. The selective gate is formed on the p-type well through a first gate insulating film (tunnel oxide film), and the floating gate is formed between adjacent two selective gates and is insulated from the p-type well through the first gate insulating film. The floating gate and the selective gate are insulated from each other by means of an insulating film formed on the side wall of the selective gate. The floating gate and the control gate formed at the upper portion thereof are insulated with a second gate insulating film. The control gate extends along rows and constitutes word lines. The selective gate extends along columns intersecting at right angles with the word lines. The n-type semiconductor regions (source, drain) are formed in the p-type well below one of side walls of the selective gate and extend along the columns intersecting at right angles with the word lines to constitute local bit lines.

Writing of information to the memory cell is carried out in such a way as to apply 15 V to a word line of a selected memory cell (0 V to other word lines), 1.2 V to a selective gate of the cell (0 V to other selective gates), 0 V to an n-type semiconductor region (source) and 4.5 V to an n-type semiconductor region (drain) of an adjacent memory cell connected to the same work line. In this condition, part of electrons (hot electrons) passing from the source to the drain is charged through the first gate insulating film (tunnel oxide film) to the floating gate.

When further microfabricated, the above-mentioned memory cell is arranged such that the floating gate and the n-type semiconductor regions come more closely to each other. This would present a problem in that a so-called drain disturb phenomenon is liable to occur wherein the electrons charged into the floating gate pass into the n-type semiconductor region (drain) of a non-selected memory cell to which 4.5 V is applied at the time of writing.

To cope with this, we have taken measures against the passage of the electrons from the floating gate into the n-type semiconductor region (drain) by forming the first gate insulating film on the n-type semiconductor region as locally more thickened so as to mitigate an electric field. This makes use of a phenomenon wherein when an oxide film is formed on the surface of a semiconductor substrate through thermal oxidation, the surface of the n-type semiconductor region, in which arsenic (As) has been ion implanted at high concentration, readily undergoes enhanced oxidation to facilitate the growth of oxidation film.

In case where the first gate insulating film is formed on the n-type semiconductor region as locally more thickened for the measure against the drain disturb, the first gate insulating film located in the vicinity of the side walls of the selective gate becomes different in thickness at opposite sides thereof. Eventually, a problem has been found in that when the semiconductor substrate is etched on the surface thereof in a manufacturing process after rendering part of the first gate insulating film thick, the thickness of the first gate insulating film varies, thus resulting in the likelihood of varying in the characteristics of the memory cell.

An object of the invention is to provide a technique of improving a manufacturing yield and reliability of a nonvolatile semiconductor memory device.

The above and other objects and novel features of the invention will become apparent from the description of the specification and the accompanying drawings.

Of the inventions disclosed in this application, typical ones are briefly described below.

A nonvolatile semiconductor memory device of the invention comprises a plurality of memory cells formed on a main surface of a semiconductor substrate of a first conduction type in matrix array, each of said memory cells comprising: a first gate formed on the main surface of the semiconductor substrate through a first insulating film made mainly of silicon oxide; a side wall spacer formed on side walls of the first gate and made of a second insulating film; a source and a drain made of a semiconductor region of a second conduction type formed in the semiconductor substrate; a second gate which is formed to cover the side wall spacer and part of which is insulated from the source and the drain through the first insulating film; and a third gate insulated from the second gate through a third insulating film, wherein the third gate extends along a first direction of the main surface of the semiconductor substrate to constitute a word line, and the source and the drain extend along a second direction intersecting with the first direction of the main surface of the semiconductor substrate to constitute a bit line.

A method for manufacturing a nonvolatile semiconductor memory device according to the invention comprises the steps of:

(a) forming a first insulating film, made mainly of silicon oxide, on a main surface of a semiconductor substrate of a first conduction type and patterning a first conductive film formed on the first insulating film to form a plurality of first gates extending in a first direction of the main surface of the semiconductor substrate;

(b) introducing an impurity into the semiconductor substrate at a portion thereof in the vicinity of one of side walls of individual first gates according to an oblique ion implantation technique to form a source and a drain each made of a semiconductor region of a second conduction type;

(c) after the step (b), thermally treating the semiconductor substrate by use of an ISSG oxidation method to increase a thickness of the first insulating film provided between adjacent first gates including the vicinity of the respective side walls of the first gates;

(d) after the step (c), subjecting a second insulating film formed on the semiconductor substrate to anisotropic etching to form a side wall spacer made of the second insulating film on the respective side walls of the first gate; and (e) after the step (d), patterning a second conductive film formed on the semiconductor substrate to form a second gate made of the second conductive film between adjacent first gates.

To put it simply, the effects and advantages obtained from the typical inventions of the present application are such that the manufacturing yield and reliability of a nonvolatile semiconductor memory device can be improved.

DETAILED DESCRIPTION OF THE PREFERRED EMBODIMENTS

Figure 1:
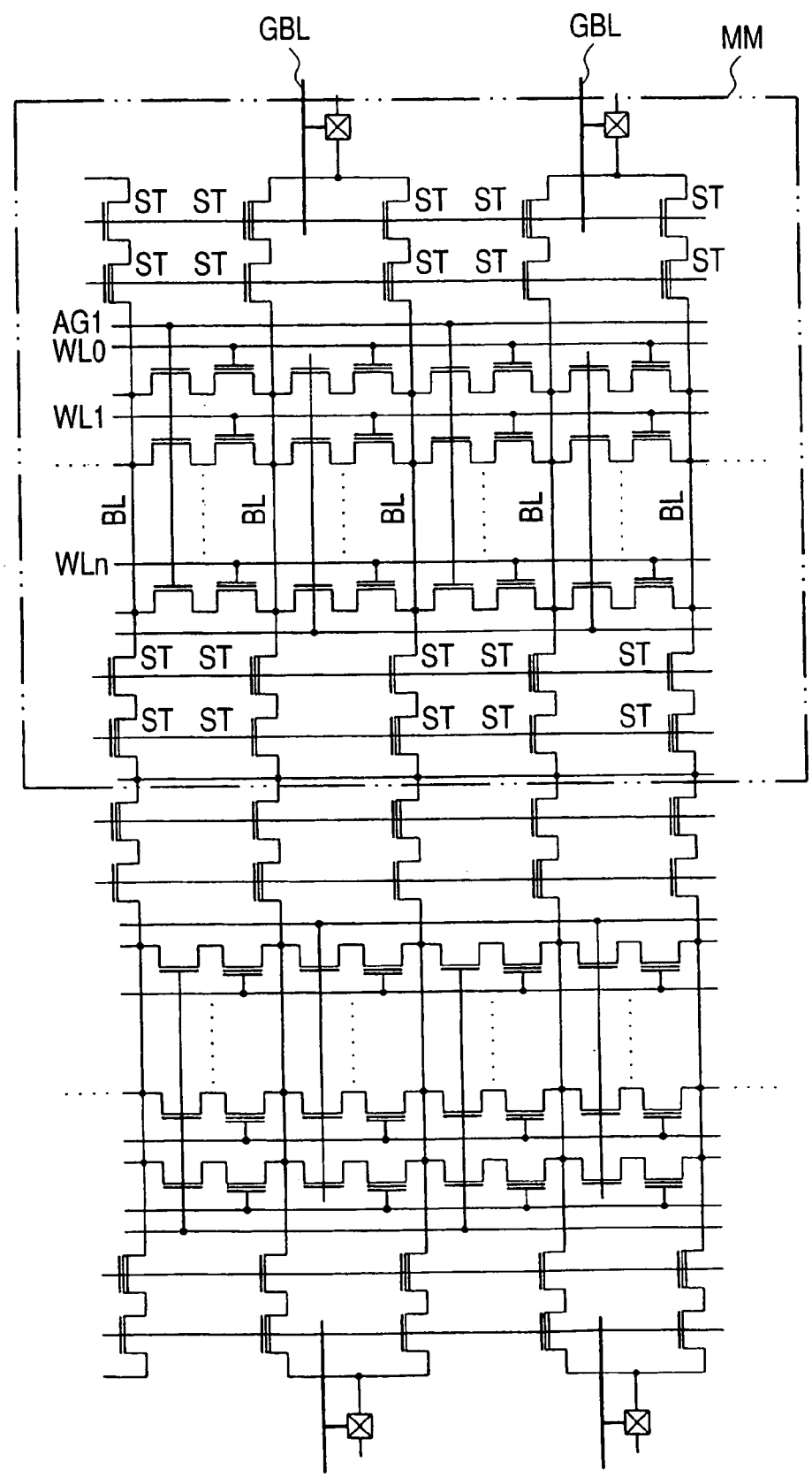
FIG. 1 is a circuit diagram showing an AND flash memory according to one embodiment of the invention.

The embodiments of the invention are described in detail with reference to the accompanying drawings. It will be noted that like reference numerals indicate in principle like members or parts throughout the figures and such members or parts are not repeatedly explained.

Embodiment 1

FIG. 1 is a circuit diagram showing an AND flash memory according to this embodiment. The memory cells of the AND flash memory are arranged in matrix at a memory array portion MM of a semiconductor substrate. As will be described hereinafter, the memory cell is constituted of n-type semiconductor regions (source, drain) formed at a p-type well of a semiconductor substrate and three gates. The three gates for the memory cell include a floating gate, a control gate and a selective gate. The control gates extend along the row to constitute word lines WL's (WL0, WL1 ... WLn). The selective gates extend along the column as intersecting at right angles with the word lines WL. The n-type semiconductor regions (source, drain) extends along the column as intersecting at right angles with the word lines WL to constitute a local bit line BL. The local bit lines BL are arranged such that adjacent two bit lines are connected to one global bit line GBL, and either of the two bit lines are selected by means of a selective transistor ST. N-type semiconductor regions (source, drain) are commonly employed with adjacent memory cells in order to reduce pitches along the row.

Writing of information to a memory cell is performed such that a word line of a selected memory cell is applied with 15 V (with the other word lines applied with 0 V), a selective gate is applied with 1.2 V (with other selective gates applied with 0 V), and the n-type semiconductor region (drain) of adjacent memory cells connected with a common word line is applied with 4.5 V, respectively. In this condition, part of the electrons (hot electrons) flowing from the source to the drain is injected into the floating gate through a first gate insulating film (tunnel oxide film). This type of wiring system is called SSI (Source-Side-Injection) writing system where hot electrons can be generated at high efficiency, so that writing in memory cell can be realized with a reduced amount of channel current. Hence, it becomes possible to permit writing in a plurality of memory cells in parallel within a range not exceeding the current supply capacity of a power supply voltage inside a chip, thus enabling the throughput of the writing to be increased. At this stage, the element isolation between the selective memory cell and the non-selective memory cell is established by means of a selective gate overlapped with the n-type semiconductor region (drain). More particularly, the selective gate of the non-selective memory cell is applied, for example, with about 0 V. Other selective electrodes are applied, for example, with 0 V so that isolation between the selective and non-selective memory cells is completed.

For readout, the selective gate is applied with 3.5 V, the source applied with 1 V and the drain applied with 0 V, under which a threshold value of the memory cell is judged. The element isolation between the selective memory cell and the non-selective memory cell is realized by means of the selective gate, like the wiring mode.

At the time of erasion, the selective gate is applied with −18 V, the source applied with 0V, the drain applied with 0V, and the selective gate applied with 0 V, under which electrons are discharged from the floating gate to the p-type well, thereby lowering the threshold value.

Next, the method of manufacturing the AND flash memory according to this embodiment is illustrated according to the steps thereof with reference to FIGS. 2 to 16. It will be noted that the sectional views attached with X-X indicate those sectional views of an essential part of a semiconductor substrate along the direction of extension (i.e. along the rows) of word lines (WL), and the sectional views attached with Y-Y indicate those sectional views of an essential part of the semiconductor substrate along the direction intersecting at right angles with the extension direction (i.e. along the columns) of the word lines (WL).

Figure 2:
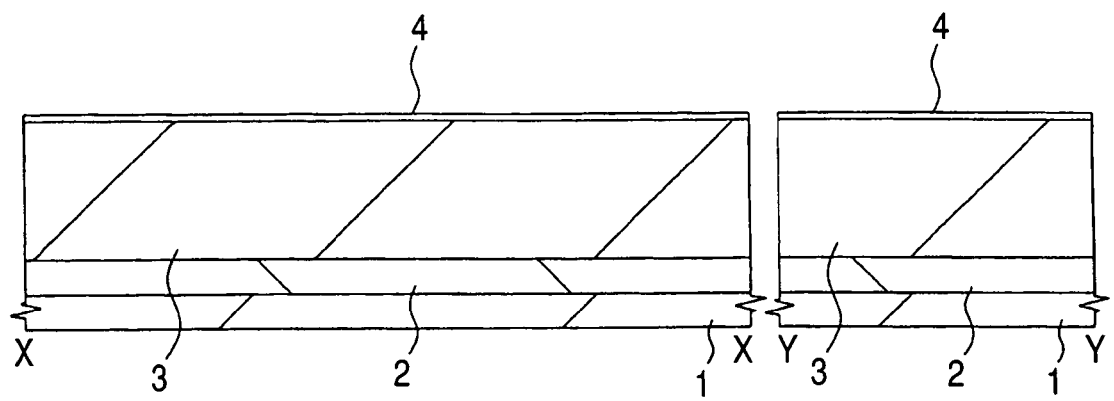
FIG. 2 is a sectional view of an essential part of a semiconductor substrate showing a manufacturing step in a method of manufacturing an AND flash memory according to an embodiment of the invention

Initially, as shown in FIG. 2, an n-type well 2 is formed on a semiconductor substrate (hereinafter referred to simply as substrate) 1 made, for example, of p-type single crystal silicon according to a well known manufacturing method. Thereafter, a p-type well 3 is formed on the n-type well 2, and a first gate insulating film (tunnel oxide film) 4 made of a silicon oxide film is formed, as an insulating film, on the surface of the p-type well 3.

Figure 3:
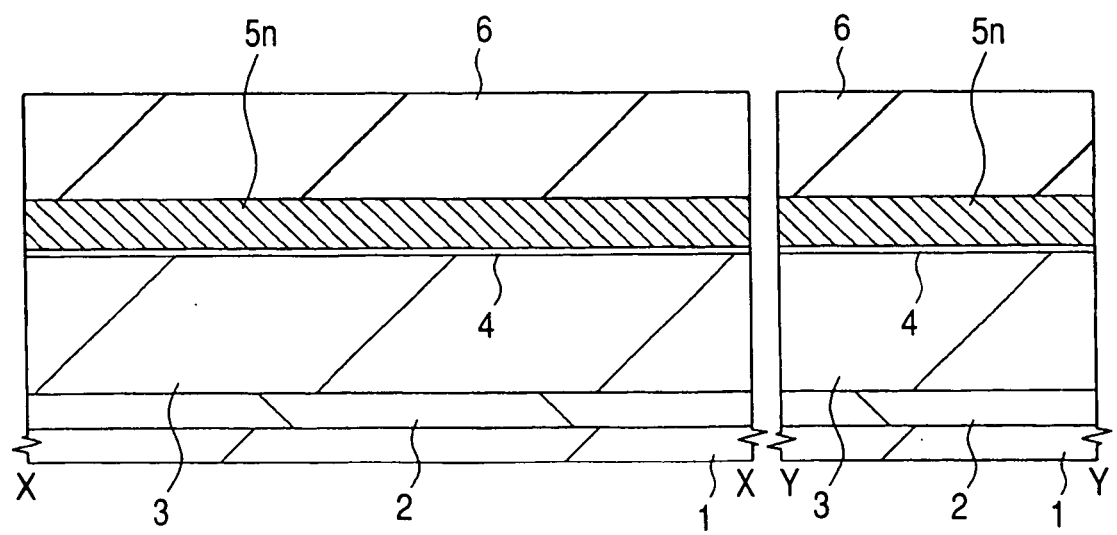
FIG. 3 is a sectional view of the essential part of the semiconductor substrate showing another step subsequent to FIG. 2 in the manufacturing method of the AND flash memory.
Figure 4:
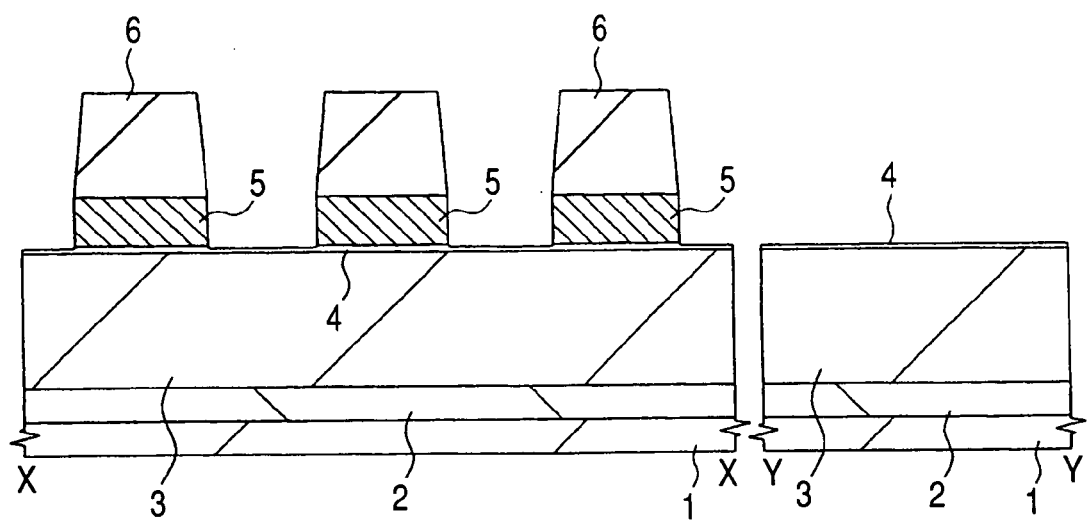
FIG. 4 is a sectional view of the essential part of the semiconductor substrate showing a further step subsequent to FIG. 3 in the manufacturing method of the AND flash memory.

Next, as shown in FIG. 3, a conductive film and an insulating film are, respectively, formed on the first gate insulating film 4. The conductive film and insulating film are deposited as an n-type polysilicon film 5n and a silicon oxide film 6, for example, according to a CVD method, respectively. Subsequently, as shown in FIG. 4, the silicon oxide film 6 and the n-type polysilicon 5n are subjected to patterning by use of a known dry etching technique using a photoresist film as a mask to form a selective gate (first gate) 5 of a conductor flake or piece made of the n-type polysilicon film 5n. The patterning is conducted such that the selective gate 5 and the silicon oxide film 6 formed thereover extend in the form of strips along the column (i.e. in a direction vertical to the paper surface as viewed in the figure), respectively. It will be noted that when the silicon oxide 6 is patterned, the side walls should conveniently be tapered so as to permit a floating gate material to be readily deposited between adjacent selective gates 5 in a subsequent step. The angle of the tapered silicon oxide film 6 is so set as to be in the range of 85 degrees to 75 degrees relative to the semiconductor substrate 1. In this embodiment, the tapered angle of the side wall at the side of the n-type semiconductor region 7, which is provided in a subsequent step, is set at 82 degrees and the angle of the side wall at the opposite side is at 80 degrees. More particularly, the angle of the side wall at the side where the n-type semiconductor region 7 is provided is made larger than the angle at the side where no n-type semiconductor region 7 is provided. Moreover, the silicon oxide film 6 functions as a protective film and cap film for protecting the selective gate 5 in a subsequent step.

Figure 5:
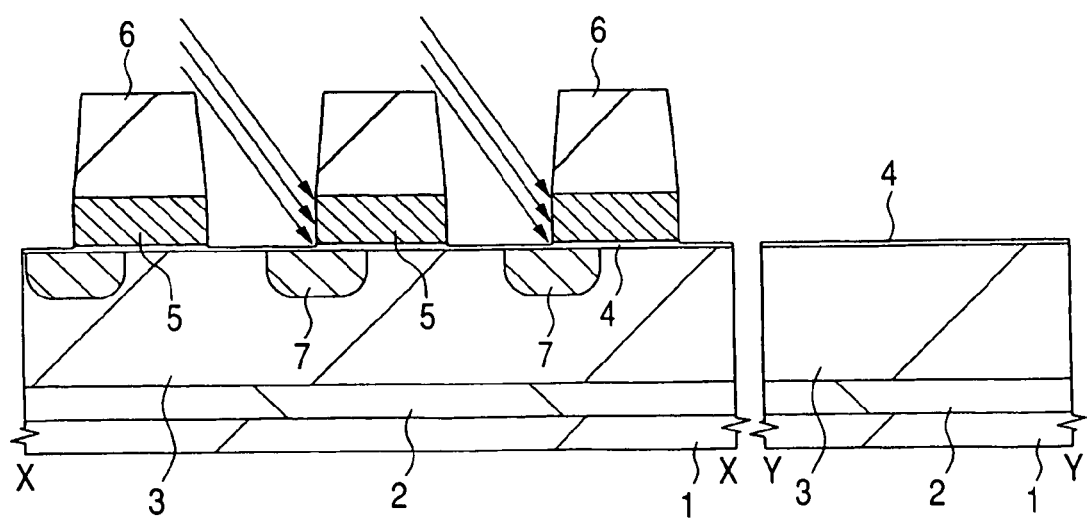
FIG. 5 is a sectional view of the essential part of the semiconductor substrate showing a further step subsequent to FIG. 4 in the manufacturing method of the AND flash memory.

Next, a shown in FIG. 5, arsenic (As) is introduced, as an impurity for permitting an n-type conduction, into the p-type well 3 in the vicinity of one of the side walls of the selective gate 5 by use of an oblique ion implantation technique to form n-type semiconductor regions (source, drain) 7 serving as a local bit line of the memory cell.

As described hereinafter, the flash memory of this embodiment has floating gates arranged along the side walls of the selective gate 5, so that "drain disturb" is liable to structurally occur. For a measure against the drain disturb, the first gate insulating film 4 which is located in the vicinity of the side wall at the side where the n-type semiconductor regions 7 are formed as being thicker than the other portions. In this way, a subsequently formed floating gate and the n-type semiconductor regions 7 can be kept away from each other.

In this embodiment, the thickness of the first gate insulating film 4 is increased by an ISSG (In-Situ Steam Generation) oxidation method (i.e. a method wherein hydrogen and oxygen are directly introduced into a thermal treating chamber and radical oxidation reaction is carried out on a heated substrate) is used. When this ISSG method is carried out using, for example, an $H_2$ concentration of not less than 10% in an atmosphere of 900° C., a 8 nm thick silicon oxide film can be formed on Si. If the temperature is lowered, lateral diffusion of the n-type semiconductor regions can be suppressed.

Figure 6:
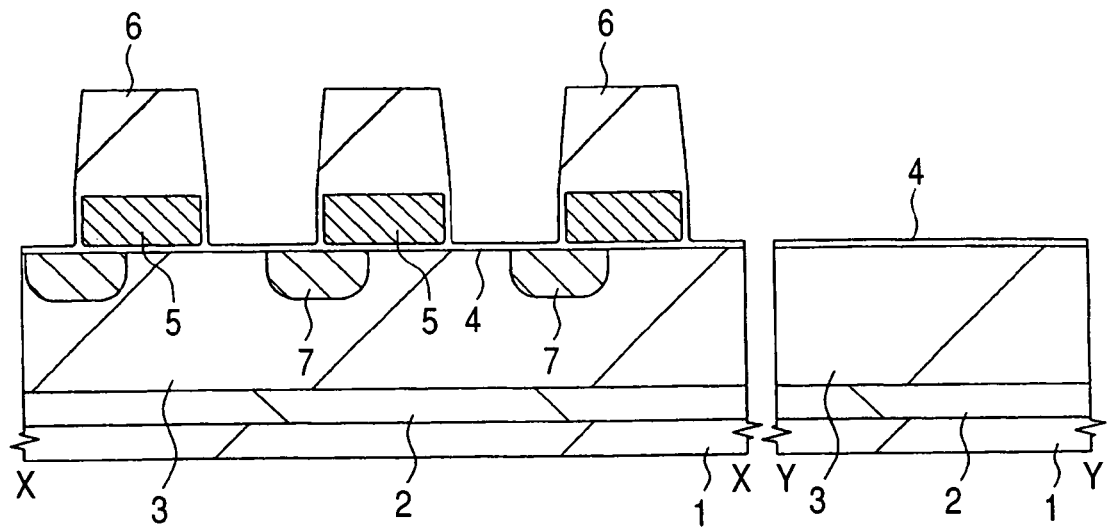
FIG. 6 is a sectional view of the essential part of the semiconductor substrate showing a still further step subsequent to FIG. 5 in the manufacturing method of the AND flash memory.
Figure 7:
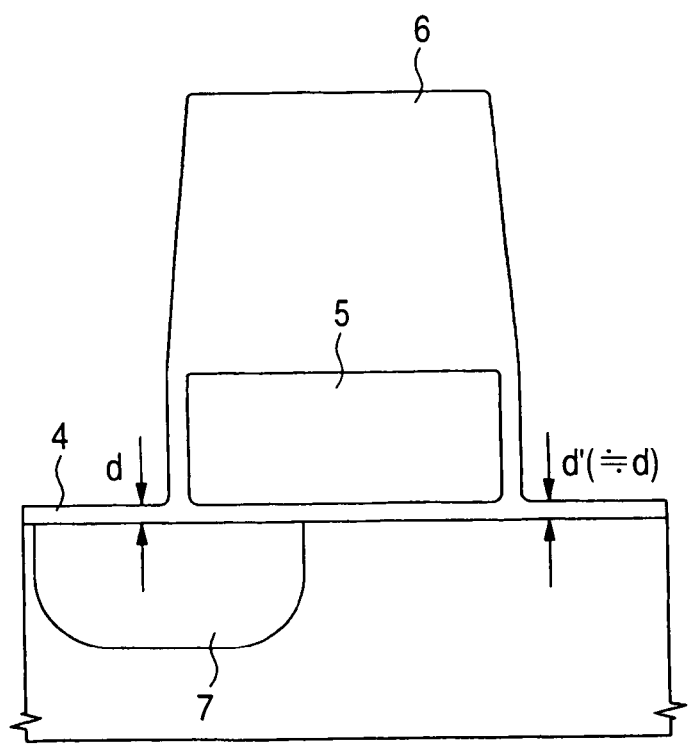
FIG. 7 is an enlarged, section view of a essential part of FIG. 6.

FIG. 6 is a sectional view showing the substrate 1 obtained immediately after the thick film formation of the first gate insulating film 4 using the ISSG oxidation method, and FIG. 7 is an enlarged, section view of a essential part thereof.

On comparison with a thermal oxidation method using an existing RTP (Rapid Thermal Process) technique, the ISSG method has such a feature that the accelerated diffusion of oxygen into the substrate 1 can be suppressed. This leads to the fact that when the substrate 1 is oxidized on the surface thereof according to the ISSG method, a thickness (d) of the first gate insulating film 4 over the n-type semiconductor region 7 introduced with arsenic (As) becomes substantially equal to a thickness (d') of the arsenic (As) free region. More particularly, the thickness of the first gate insulating film becomes substantially uniform throughout the selective gates 5 including the vicinity of the both side walls of the selective gates 5. Moreover, when using the ISSG method for oxidation, the insulating film 4 is formed on side surfaces of the selective gate 5.

Figure 8:
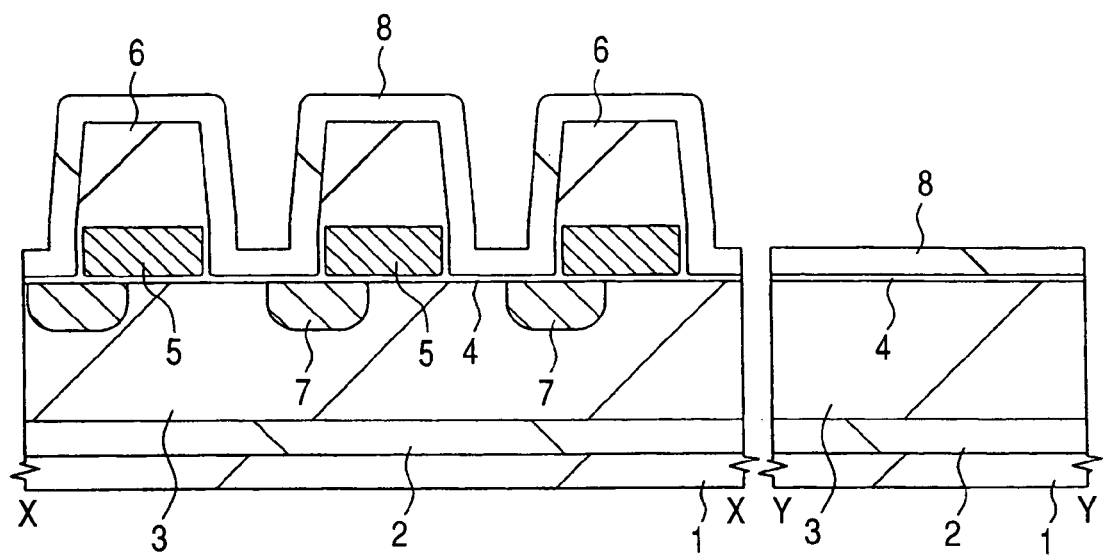
FIG. 8 is a sectional view of the essential part of the semiconductor substrate showing another step subsequent to FIG. 7 in the manufacturing method of the AND flash memory.
Figure 9:
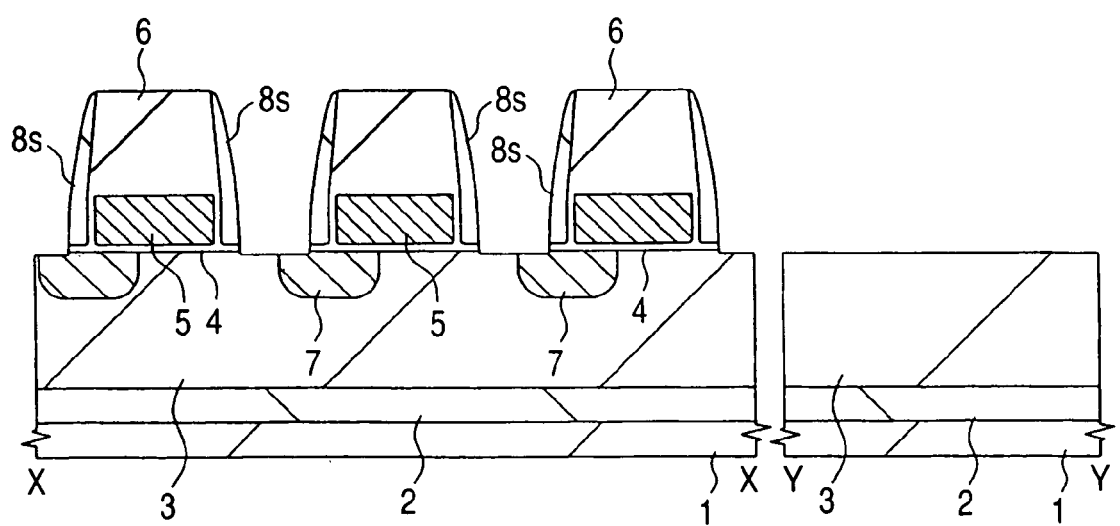
FIG. 9 is a sectional view of the essential part of the semiconductor substrate showing still another further step subsequent to FIG. 8 in the manufacturing method of the AND flash memory.

Next, as shown in FIG. 8, a silicon oxide film 8 is deposited, as an insulating film, on the substrate 1 according to a CVD method. The silicon oxide film 8 is deposited in such a thickness as not to fully bury a gap between adjacent selective gates 5. Subsequently, as shown in FIG. 9, the silicon oxide film 8 is anisotropically etched to form a side wall spacer 8s made of the silicon oxide film 8 on both side walls of the selective gate 5. The side wall spacer 8s is formed so that a withstand voltage between a floating gate formed subsequently and the selective gate is ensured.

As shown in FIG. 9, the fist gate insulating film 4 between adjacent selective gates 5 is also etched to permit the substrate 1 to be exposed. As stated hereinbefore, the first gate insulating film 4 that has been subjected to thick film formation by use of the ISSG oxidation method has high uniformity in thickness. When anisotropic etching is carried out in this condition, little variation locally occurs with respect to the reduction of film thickness. On the other hand, where the first insulating film 4 is subjected to thick film formation according to a thermal oxidation method using the RTP system, the first gate insulating film 4 is formed as having different thicknesses in the vicinity of both side walls of the selective gate 5. When the anisotropic etching is carried out in this condition, the reduction of the film thickness locally varies, thereby causing the memory cell characteristics to vary. If overetching is performed so as not to allow the film thickness to be varied, the substrate 1 is deeply removed in the surface thereof, resulting in the degradation of element characteristics. Thus, according to this embodiment where the first gate insulating film 4 is formed as being uniformly thick according to the ISSG oxidation method, such a problem as set out hereinbefore can be avoided while suppressing the drain disturb.

Figure 10:
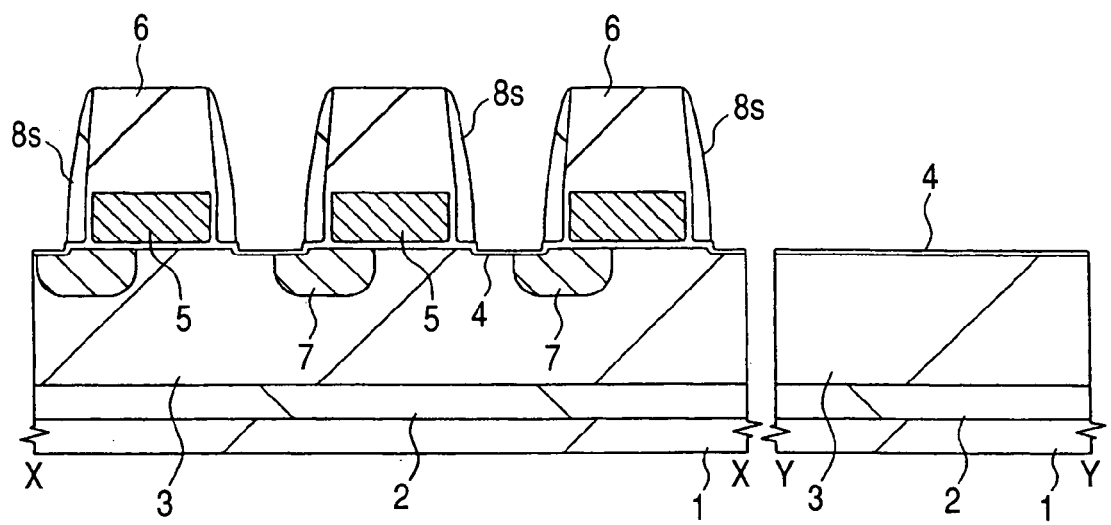
FIG. 10 is a sectional view of the essential part of the semiconductor substrate showing yet another step subsequent to FIG. 9 in the manufacturing method of the AND flash memory.

Next, as shown in FIG. 10, the thermal oxidation of the substrate 1 enables the first gate insulating film 4, made of a silicon oxide film, to be regenerated on the surface of the substrate between adjacent selective gates 5. Although this thermal oxidation may be carried out by a known wet oxidation method, the use of the ISSG oxidation method allows the regeneration of the first gate insulating film 4 which is more uniform in thickness.

Figure 11:
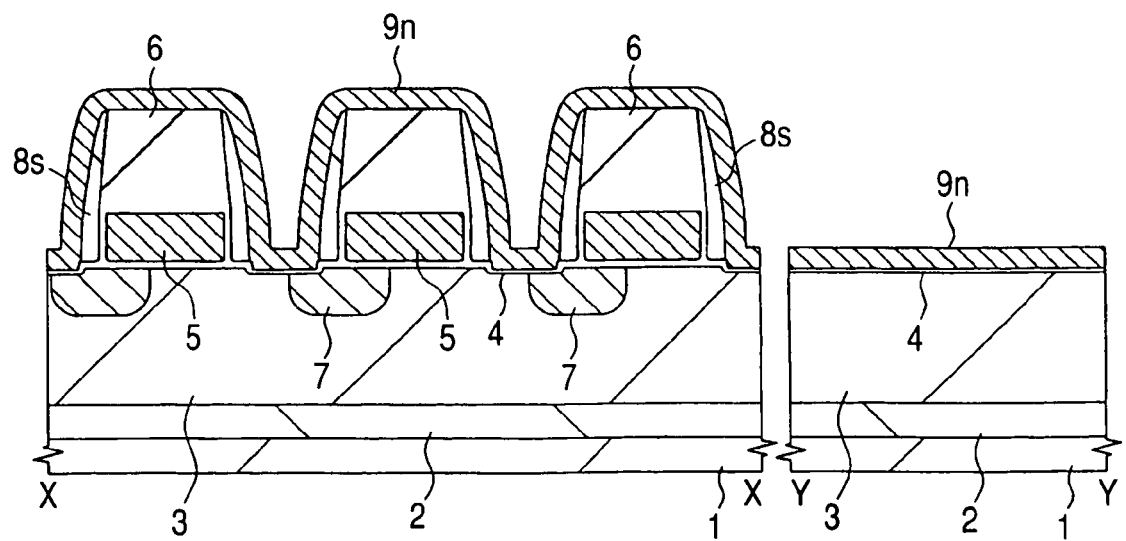
FIG. 11 is a sectional view of the essential part of the semiconductor substrate showing another step subsequent to FIG. 10 in the manufacturing method of the AND flash memory.
Figure 12:
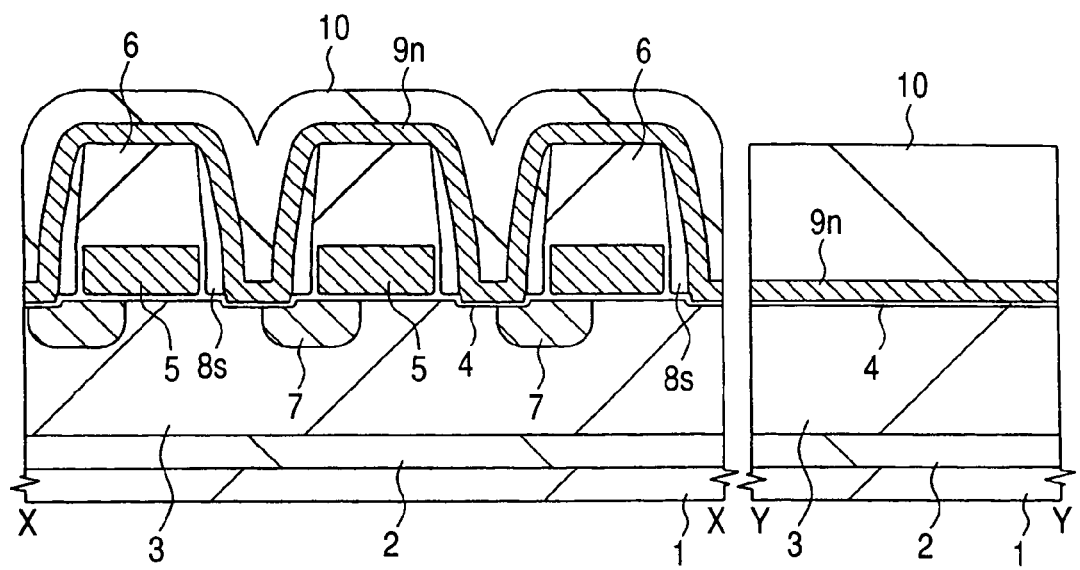
FIG. 12 is a sectional view of the essential part of the semiconductor substrate showing another step subsequent to FIG. 11 in the manufacturing method of the AND flash memory.

Next, as shown in FIG. 11, an n-type polysilicon film 9n is deposited, as a conductive film, on the substrate 1 by a CVD method. The n-type polysilicon film 9n is deposited in such a thickness as not to fully bury a space between adjacent selective gates 5. Subsequently, as shown in FIG. 12, an anti-reflective film (BARC: Bottom-Anti-Reflective Coating) 10 is deposited over the substrate 1. The anti-reflective film 10 is a film which protects the n-type polysilicon film 9n provided on the side walls of the selective gate 5 and between the selective gates 5 from being etching when the n-type polysilicon film 9n formed above the selective gate 5 is etched in a subsequent step. For this purpose, the anti-reflective film 10 is deposited in such a thickness as to bury the space between adjacent selective gates 5. It will be noted that the protective film for burying the space between the selective gates 5 is not limited to the anti-reflective film 10, but may be made of other types of insulating films so far as they differ in etching selection ratio from the n-type polysilicon film 9n and the silicon oxide film 6.

Figure 13:
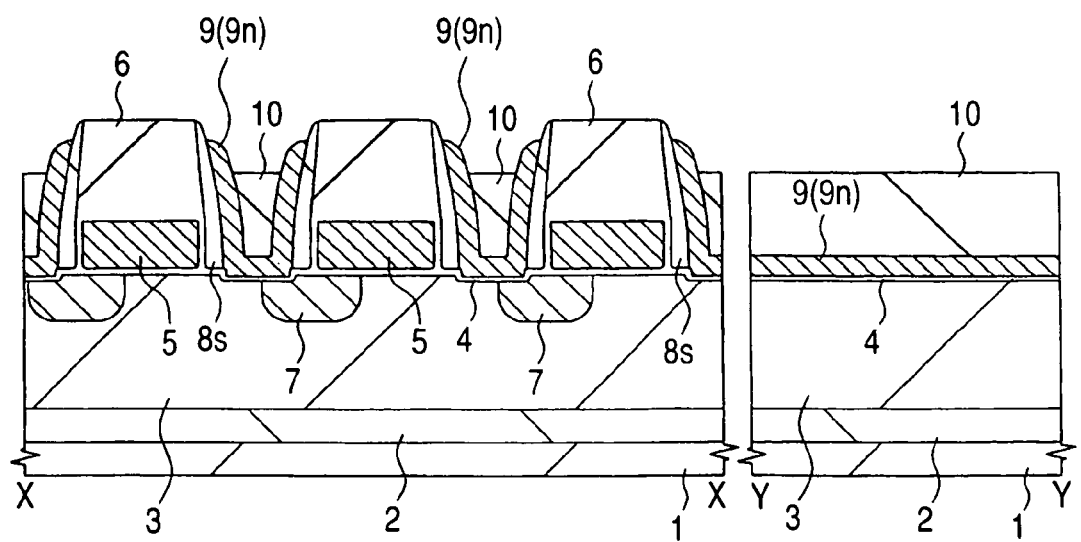
FIG. 13 is a sectional view of the essential part of the semiconductor substrate showing another step subsequent to FIG. 12 in the manufacturing method of the AND flash memory.

Next, as shown in FIG. 13, the anti-reflective film 10 and the n-type polysilicon film 9n provided therebeneath are etched back. The etching of the anti-reflective film 10 and n-type polysilicon film 9n provided above the selective gate 5 allows a floating gate (second gate) 9 in the form of a conductor flake or piece made of the n-type polysilicon film 9n to be formed on the side walls of the selective gate 5 and between adjacent selective gates 5. The floating gate 9 is so patterned as to extend in strips along the direction of extension (i.e. the direction of column) of the selective gate 5.

Figure 14:
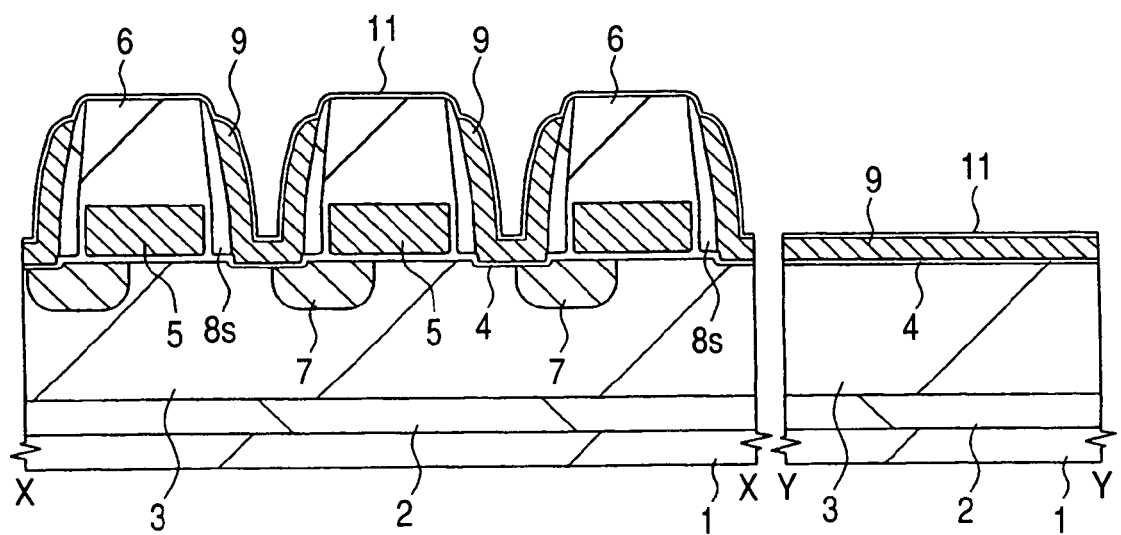
FIG. 14 is a sectional view of the essential part of the semiconductor substrate showing another step subsequent to FIG. 13 in the manufacturing method of the AND flash memory.

Next, the anti-reflective film 10 left between the selective gates 5 is removed by ashing, after which, as shown in FIG. 14, a second gate insulating film 11 is formed on the surface of the floating gate 9 as an insulating film between the floating gate 9 and a control gate 12. The second insulating film 11 is constituted of a silicon oxide film, a silicon nitride film and a silicon oxide film, all formed, for example, according to a CVD method.

Figure 15:
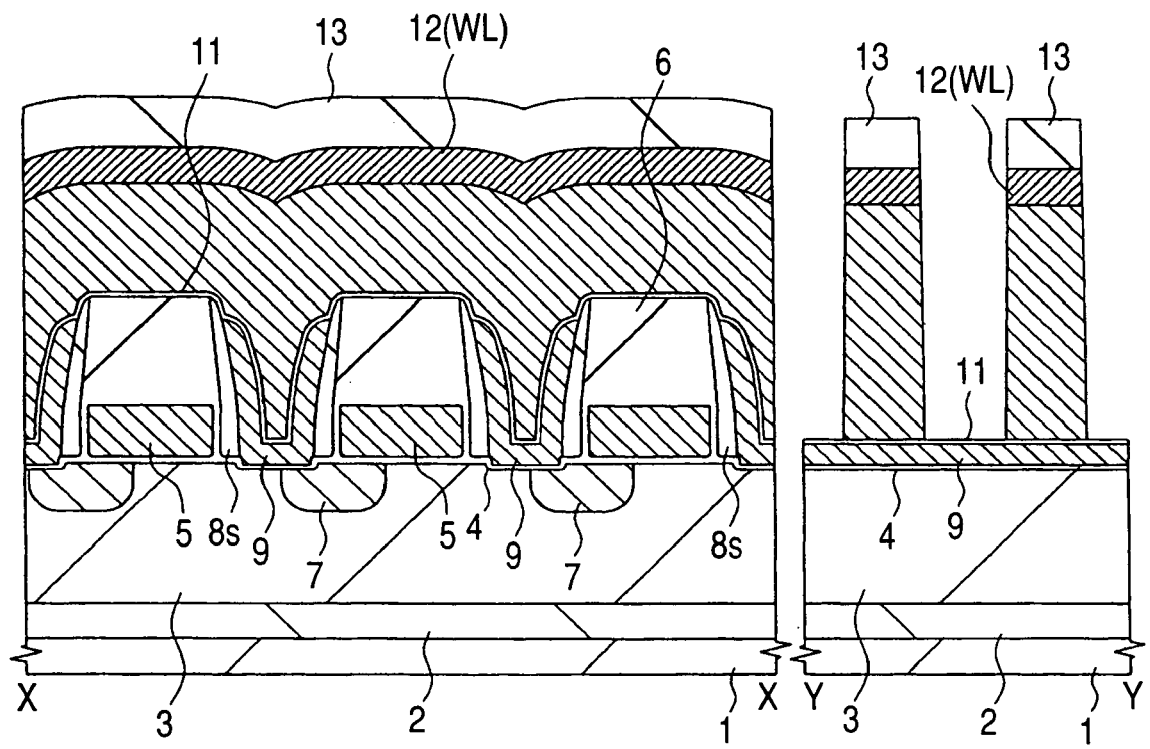
FIG. 15 is a sectional view of the essential part of the semiconductor substrate showing another step subsequent to FIG. 14 in the manufacturing method of the AND flash memory.

As shown in FIG. 15, a conductor film serving as a word line (WL) of memory cell is formed over the second insulating film 11. This conductor film is formed by depositing a polycide film, which is a builtup film of an n-type polysilicon film and a W (tungsten) film, and a silicon oxide film 13 according to a CVD method. Thereafter, the silicon oxide film 13 and the polycide film are patterned according to a known dry etching technique using a photoresist film as a mask, thereby forming a control gate (third gate) 12 in the form of a conductor flake made of the polycide film. The control gate is so patterned as extending in a strip along the direction of row (i.e. in a lateral direction as view in the figure) to constitute a word line (WL). When the control gate is patterned by dry etching, the second gate insulating film functions as an etching stopper.

Figure 16:
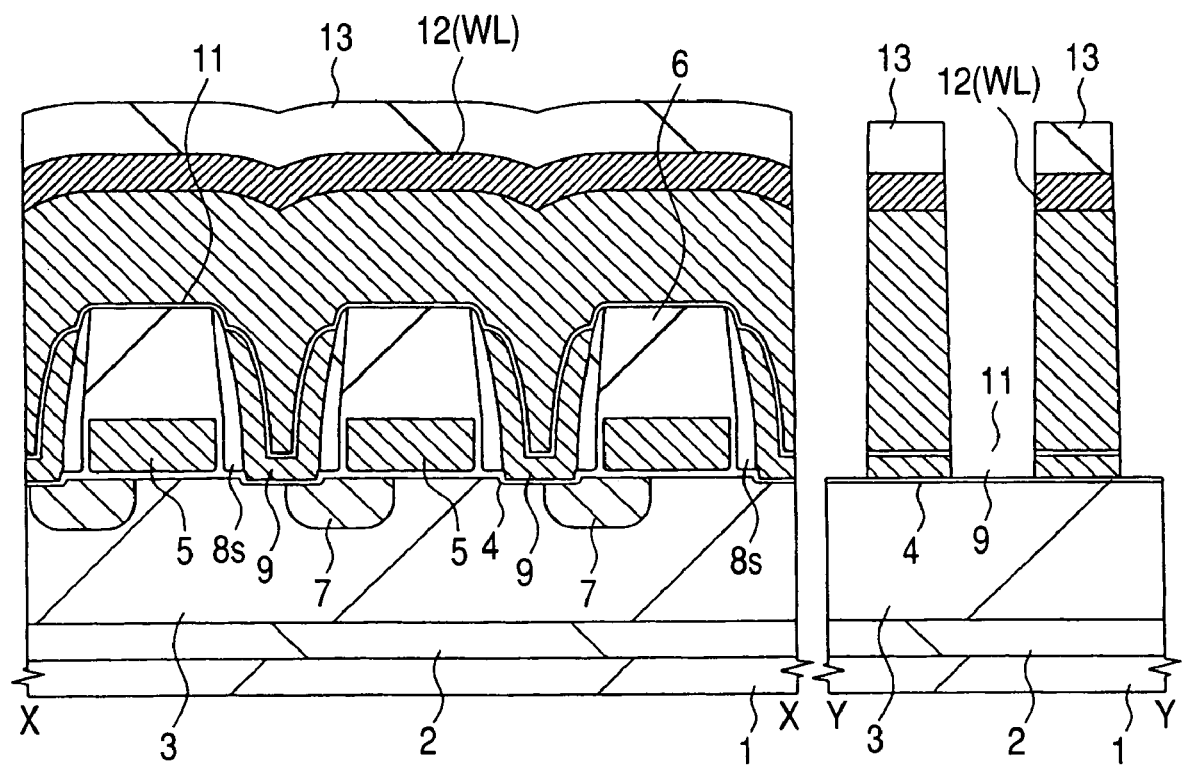
FIG. 16 is a sectional view of the essential part of the semiconductor substrate showing another step subsequent to FIG. 15 in the manufacturing method of the AND flash memory.

Next, as shown in FIG. 16, the exposed second gate insulating film 11 is removed by a known dry or wet etching technique, followed by separation of the selective gates 5 by dry etching to complete a memory cell.

Embodiment 2

This embodiment is an application to a nonvolatile memory having a MONOS (Metal Oxide Nitride Oxide Semiconductor).

Figure 17:
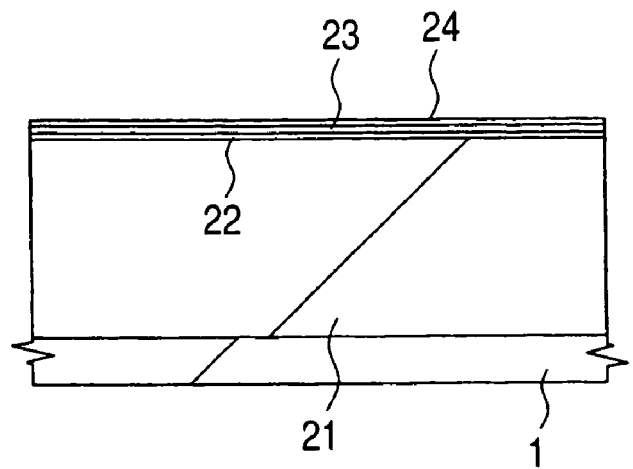
FIG. 17 is a an essential part of a semiconductor substrate showing a step in a method of manufacturing a nonvolatile memory having a MONOS transistor according to another embodiment of the invention.

For the formation of the MONOS transistor of this embodiment, a p-type well 21 is initially formed, as shown in FIG. 17, on a substrate 1 according to a known manufacturing method. Thereafter, a builtup insulating film including a charge storage film is formed on the substrate 1. The builtup insulating film including the charge storage film is formed by thermally oxidizing the substrate 1 to form a silicon oxide film 22 on the surface of the p-type well. Subsequently, a charge storage film 23 made of a silicon nitride film is formed over the silicon oxide film 22 according to a CVD method, followed by further formation of a silicon oxide film 24, as an insulating film, over the charge storage film 23 by use of a CVD method. A silicon oxide film 24 is formed, as an insulating film, over the charge storage film 23 according to a CVD method. This siliconoxide film 24 maybe formed by the ISSG oxidation method. The charge storage film 23 may be made of those films other than a silicon nitride film provided that they have a trap level in the film such as, for example a silicon oxide nitride film or a Si nanodot.

Figure 18:
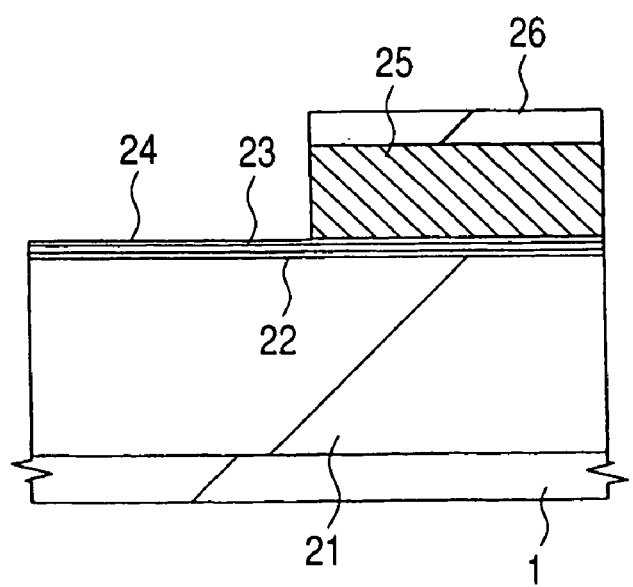
FIG. 18 is a sectional view of the essential part of the semiconductor substrate showing another step subsequent to FIG. 17 in the manufacturing method of the nonvolatile memory having the MONOS transistor.

Next, as shown in FIG. 18, an n-type polysilicon film serving as a conductive film and a silicon oxide film 26 serving as an insulating film are, respectively, deposited over the silicon oxide film 24 according to the CVD method. Thereafter, a known dry etching technique using a photoresist film as a mask is used to subject the silicon oxide film 26 and the n-type polysilicon film to patterning, thereby forming a memory gate 25 made of the n-type polysilicon film and the silicon oxide film 26.

Figure 19:
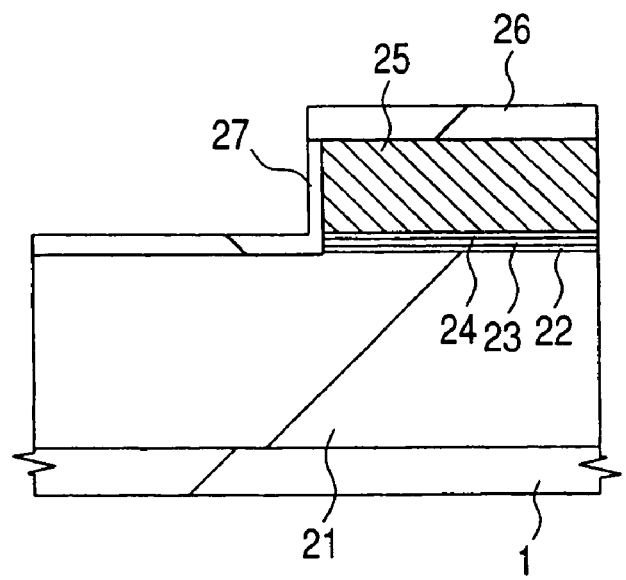
FIG. 19 is a sectional view of the essential part of the semiconductor substrate showing a further step subsequent to FIG. 18 in the manufacturing method of the nonvolatile memory having the MONOS transistor.

Next, as shown in FIG. 19, the memory gate 25 is oxidized at the side walls thereof to form a silicon oxide film 27. In this embodiment, for the oxidation of the side walls of the memory gate 25, the substrate is thermally treated according to the ISSG oxidation method. As stated in Embodiment 1, the ISSG oxidation method is one wherein hydrogen and oxygen are directly introduced into a thermal treating chamber under reduced pressure to permit a radiation oxidation reaction to be carried out on a heated substrate. This method enables strong oxidation action of oxidizing not only silicon, but also silicon nitride. Accordingly, if the side walls of the memory gate 25 are oxidized by use of this method, the charge storage film 23 which is made of the silicon nitride film in a region not covered with the memory gate 25 is also oxidized, thereby forming a silicon oxide film 27 having a uniform thickness.

If, however, the silicon oxide film 27 is formed according to a known thermal oxidizing method, the memory gate 25 is oxidized at an end portion thereof (i.e. at an interface between the memory gate 25 and the silicon oxide film 24), thereby causing a so-called bird's peak to occur (not shown) The occurrence of such a bird's peak permits an electric field at the end of the memory gate 25 to be changed, thereby resulting in the problem of writing or erasing error. In this embodiment using the ISSG oxidation method, however, the occurrence of such a bird's peak can be more suppressed over the known thermal oxidation method.

Figure 20:
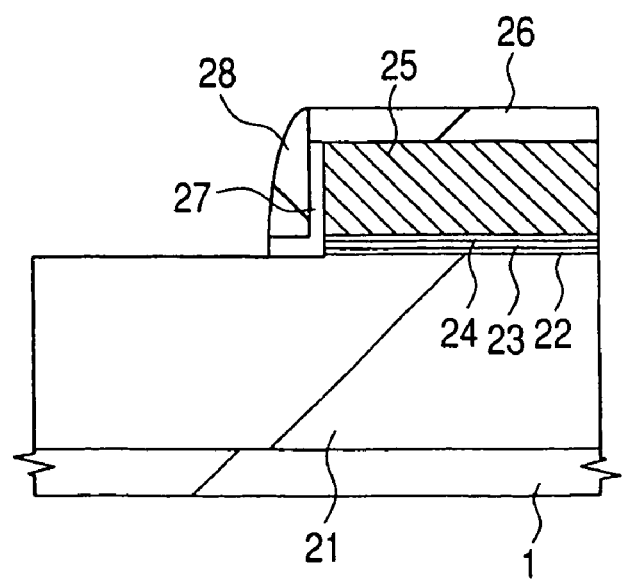
FIG. 20 is a sectional view of the essential part of the semiconductor substrate showing a still further step subsequent to FIG. 19 in the manufacturing method of the nonvolatile memory having the MONOS transistor.

Next, as shown in FIG. 20, a side wall spacer 28 is formed on the side walls of the memory gate 25 by subjecting the insulating film deposited on the substrate 1 by a CVD method to anisotropic etching to form a side wall spacer 28 on the side walls of the memory gate 25. For the insulating film for forming the side wall spacer 28, mention is made, for example, of a silicon oxide film or silicon nitride film.

For carrying out the above-mentioned anisotropic etching, the silicon oxide film 27 in a region not covered with the memory gate 25 is also etched to expose the surface of the substrate 1. As stated hereinbefore, the silicon oxide film 27 formed by the use of the ISSG oxidation method has high uniformity in thickness. Therefore, when etching is carried out, little local variation takes place with respect to the reduction in amount of the film thickness. This enables one to reduce the degree of overetching of the substrate 1. Moreover, since the silicon oxide film 27 is formed on the side surfaces of the memory gate 25 according to the ISSG oxidation method, a more uniform film thickness along the longitudinal direction is ensured over the case using the known thermal oxidation method, and the so-called bird's peak-shaped oxidation at the end of the memory gate 25 can be suppressed. Using these formation methods and the effects of the resultant shapes, the characteristic degradation of the MONOSD transistor can be prevented.

Figure 21:
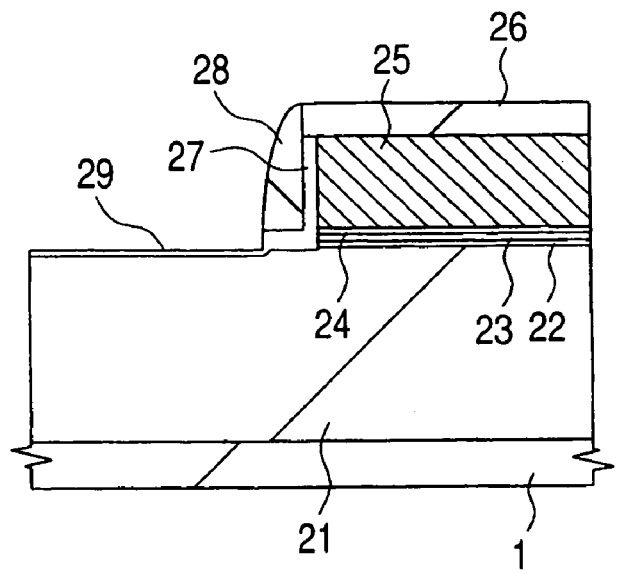
FIG. 21 is a sectional view of the essential part of the semiconductor substrate showing another step subsequent to FIG. 20 in the manufacturing method of the nonvolatile memory having the MONOS transistor.

Next, as shown in FIG. 21, the substrate is thermally oxidized to form a gate insulating film 29, made of silicon oxide, on the surface of the substrate 1 exposed by the etching. This thermal oxidation may be carried out by a known wet oxidation method. When the ISSG oxidation method stated hereinabove is used for this purpose, the gate insulating film is formed as a gate insulating film of a control gate 30 formed in a step described hereinafter.

Figure 22:
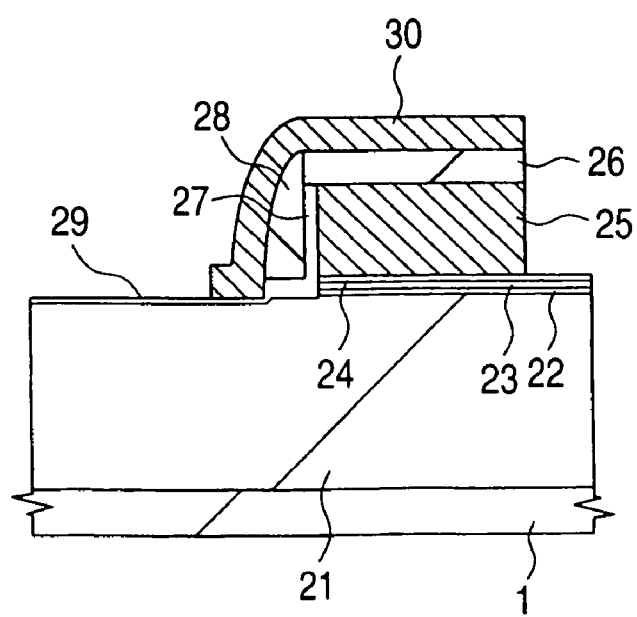
FIG. 22 is a sectional view of the essential part of the semiconductor substrate showing another step subsequent to FIG. 21 in the manufacturing method of the nonvolatile memory having the MONOS transistor.
Figure 23:
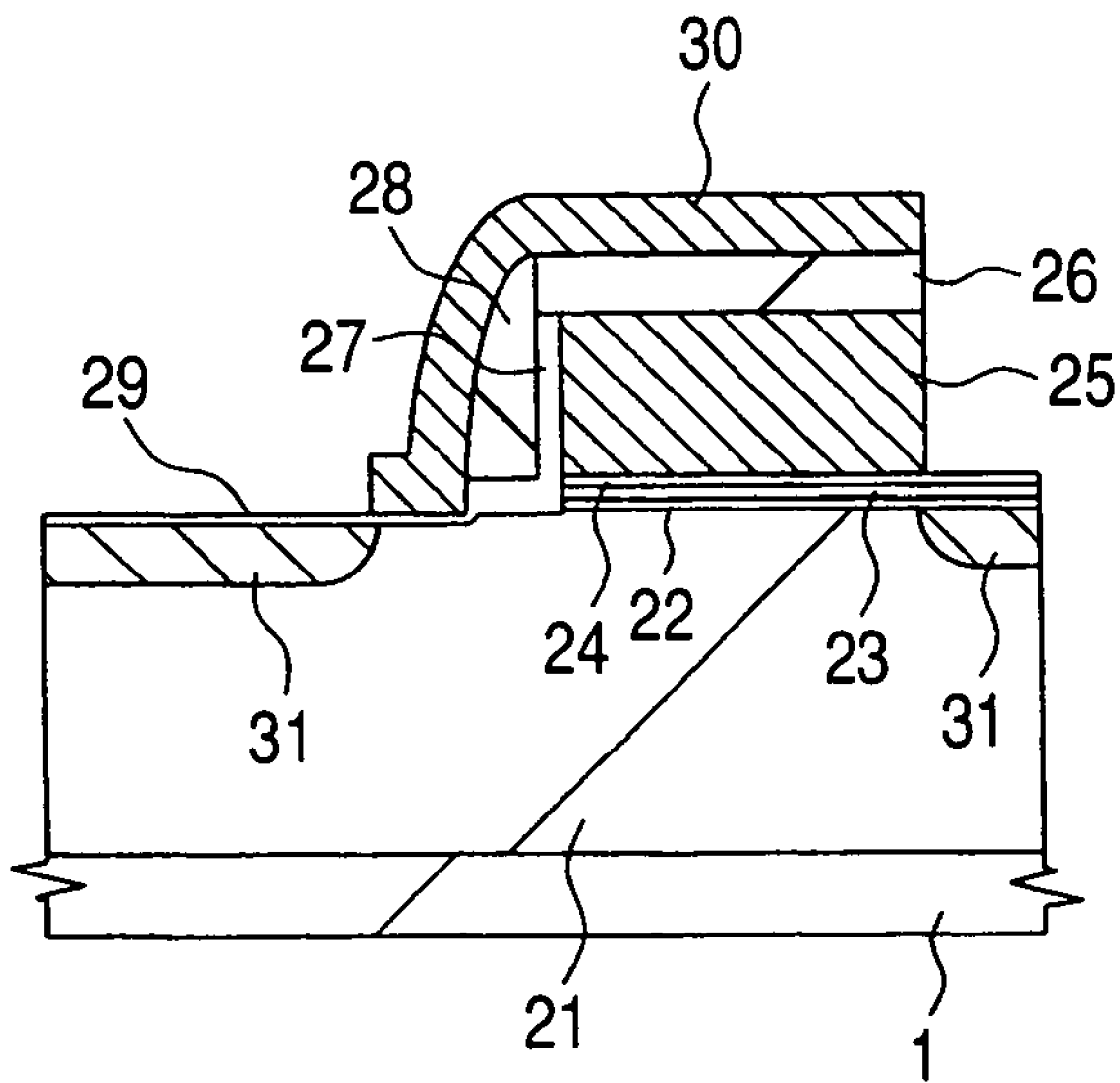
FIG. 23 is a sectional view of the essential part of the semiconductor substrate showing still another step subsequent to FIG. 22 in the manufacturing method of the nonvolatile memory having the MONOS transistor.

Next, as shown in FIG. 22, the n-type polysilicon film deposited on the substrate 1 by a CVD method is patterned to form a control gate 30 covering the side walls and the top of the memory gate 25. Thereafter, as shown in FIG. 23, an impurity (phosphorus or arsenic) is ion implanted into the p-type well to form n-type semiconductor regions (source, drain), thereby completing a memory cell having a MONOS transistor.

Although the invention has been particularly illustrated based on the embodiments, the invention should not be construed as limiting to these embodiments and many variation and alterations may be possible without departing from the spirit of the invention.

For instance, in the embodiments, the n-type semiconductor regions (source, drain) 7 are formed after the formation of the memory gate (see FIG. 5), such formation may be effected after the formation of the floating gate 9*n* (see FIG. 11).

The invention is directed to a technique useful for application to nonvolatile semiconductor memory devices.

What is claimed is:

1. A method for manufacturing a nonvolatile semiconductor memory device comprising the steps of:
    (a) forming a first conductor piece over a semiconductor substrate of a first conduction type through a first insulating film;
    (b) forming a second insulating film over side walls of said first conductor piece and over said semiconductor substrate according to an ISSG oxidation method;
    (c) after the step (b), forming a third insulating film to cover said first conductor piece;
    (d) etching the second and third insulating films to form a side wall spacer over side walls of said first conductor piece;
    (e) after the step (d), forming a fourth insulating film over said semiconductor substrate according to an ISSG oxidation method; and
    (f) after the step (e), forming a second conductor piece over said fourth insulating film and over the side walls of said first conductor piece.

2. The method for manufacturing a nonvolatile semiconductor memory device according to claim 1, further comprising the steps of:
    (g) after the step (f), forming a fifth insulating film over said second conductor piece; and
    (h) forming a third conductor piece over said fifth insulating film.

3. A method for manufacturing a nonvolatile semiconductor memory device comprising the steps of:

(a) forming first gates over a semiconductor substrate of a first conductivity type through a first insulating film;

(b) introducing an impurity into said semiconductor substrate in the vicinity of one of the side walls of the respective first gates to form respective impurity regions of opposite conductivity type to the first conductivity type in the semiconductor substrate;

(c) after the step (b), thermally treating said semiconductor substrate by an ISSG oxidation method to oxidize the semiconductor substrate between adjacent first gates;

(d) after the step (c), forming side wall spacers on the side walls of the first gates; and (e) after the step (d), patterning a second conductive film formed over the semiconductor substrate to form second gates, comprised of said second conductive film, between the first gates.

4. The method for manufacturing a non-volatile semiconductor memory device according to claim 3, wherein said impurity introduced into said semiconductor substrate in the step (b) is made of arsenic.

5. The method for manufacturing a non-volatile semiconductor memory device according to claim 4, wherein an oblique ion implantation method is used for the introduction of said impurity into said semiconductor substrate in the step (b).

6. The method for manufacturing a nonvolatile semiconductor memory device according to claim 3, further comprising the steps, after step (e), of:

(f) forming another insulating film over said second gates; and (g) forming third gates over said another insulating film, with said another insulating film interposed between the third gates and the second gates.

7. The method for manufacturing a nonvolatile semiconductor memory device according to claim 6, wherein a memory cell is constituted of the first, second and third gates, a source and a drain, said first insulating film and said another insulating film, wherein said third gates constitute word lines extending in a first direction of the main surface of said semiconductor substrate, and wherein said source and said drain constitute bit lines extending in a second direction intersecting with said first direction of the main surface of said semiconductor substrate.

8. The method for manufacturing a nonvolatile semiconductor memory device according to claim 7, wherein said source and said drain are, respectively, formed at a lower portion of one of side walls of said first gates and are used in common with two memory cells adjacent along a direction of extension of said word lines.

9. The method for manufacturing a nonvolatile semiconductor memory device according to claim 7, wherein information is written into said memory cell by injecting hot electrons, generated in channel regions below said first gates, into said second gates through said first insulating film.

10. The method for manufacturing a nonvolatile semiconductor memory device according to claim 6, wherein said first gates extend in a first direction, and said third gates extend in a second direction intersecting said first direction.

11. A method for manufacturing a nonvolatile semiconductor memory device comprising the steps of:

(a) forming a first insulating film, mainly comprised of silicon oxide, over a main surface of a semiconductor substrate of a first conduction type and subjecting a first conductive film, formed over said first insulating film, to patterning, thereby forming a plurality of first gates extending in a first direction of the main surface of said semiconductor substrate;

(b) introducing an impurity into said semiconductor substrate to form a source and a drain each made of a semiconductor region of a second conduction type;

(c) after the step (b), thermally treating said semiconductor substrate by use of an ISSG oxidation method to increase a thickness of said first insulating film between adjacent first gates;

(d) after the step (c), subjecting a second insulating film formed over said semiconductor substrate to anisotropic etching to form a side wall spacer, comprised of said second insulating film, over the respective side walls of said first gates;

(e) after the step (d), patterning a second conductive film formed over said semiconductor substrate to form second gates, comprised of said second conductive film, between adjacent first gates; and f) after the step (e), forming a third insulating film over said second gates and forming a third conductive film over said third insulating film, followed by patterning of said third conductive film to form a plurality of third gates extending in a second direction intersecting with said first direction of the main surface of said semiconductor substrate, wherein a memory cell is constituted of the first, second and third gates, the source and drain, said first insulating film and said third insulating film, wherein said third gates constitute word lines extending in the first direction of the main surface of said semiconductor substrate, and wherein said source and said drain constitute bit lines extending in the second direction intersecting with said first direction of the main surface of said semiconductor substrate.

12. The method for manufacturing a nonvolatile semiconductor memory device according to claim 11, wherein after the step (d) but prior to the step (e), thermally treating said semiconductor substrate by use of an ISSG oxidation method so as to regenerate said first insulating film etched off by the anisotropic etching in the step (d).

13. The method for manufacturing a non-volatile semiconductor memory device according to claim 11, wherein said impurity introduced into said semiconductor substrate in the step (b) is made of arsenic.

14. The method for manufacturing a non-volatile semiconductor memory device according to claim 11, wherein an oblique ion implantation method is used for the introduction of said impurity into said semiconductor substrate in the step (b).

15. The method for manufacturing a nonvolatile semiconductor memory device according to claim 11, wherein said source and said drain are, respectively, formed at a lower portion of one of side walls of said first gates and are used in common with two memory cells adjacent along a direction of extension of said word lines.

16. The method for manufacturing a nonvolatile semiconductor memory device according to claim 11, wherein information is written into said memory cell by injecting hot electrons, generated in channel regions below said first gates, into said second gates through said first insulating film.

17. A method for manufacturing a nonvolatile semiconductor memory device comprising the steps of:
(a) forming a first conductor piece over a semiconductor substrate of a first conduction type through a first insulating film;
(b) introducing an impurity into said semiconductor substrate by an oblique ion implantation technique to form a semiconductor region of a second conduction type;
(c) forming a second insulating film over side walls of said first conductor piece and over said semiconductor substrate according to an ISSG oxidation method;
(d) after the step (c), forming a third insulating film to cover said first conductor piece;
(e) etching the second and third insulating films to form a side wall spacer over side walls of said first conductor piece;
(f) after the step (e), forming a fourth insulating film over said semiconductor substrate according to an ISSG oxidation method;
(g) after the step (f), forming a second conductor piece over said fourth insulating film and over the side walls of said first conductor piece; and
(h) after the step (g), forming a fifth insulating film over said second conductor piece and forming a third conductive film over said third insulating film, followed by patterning of said third conductive film to form a plurality of third conductor pieces,
wherein a memory cell is constituted of the first, second and third conductor pieces, and said first, fourth and fifth insulating films,
wherein said third conductor pieces constitute a word line of said memory cell, and
wherein said semiconductor region constitutes a bit line of said memory cell.

* * * * *